(12) United States Patent
Yoshidome et al.

(10) Patent No.: US 12,203,163 B2
(45) Date of Patent: Jan. 21, 2025

(54) METHODS FOR SHAPING MAGNETIC FIELDS DURING SEMICONDUCTOR PROCESSING

(71) Applicant: Applied Materials, Inc., Santa Clara, CA (US)

(72) Inventors: Goichi Yoshidome, Albany, CA (US); Suhas Bangalore Umesh, Sunnyvale, CA (US); Sushil Arun Samant, Thane (IN); Martin Lee Riker, Milpitas, CA (US); Wei Lei, Campbell, CA (US); Kishor Kumar Kalathiparambil, Santa Clara, CA (US); Shirish A. Pethe, Cupertino, CA (US); Fuhong Zhang, San Jose, CA (US); Prashanth Kothnur, San Jose, CA (US); Andrew Tomko, Redwood City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 665 days.

(21) Appl. No.: 17/334,630

(22) Filed: May 28, 2021

(65) Prior Publication Data
US 2022/0380888 A1     Dec. 1, 2022

(51) Int. Cl.
    *C23C 14/35* (2006.01)
    *H01J 37/34* (2006.01)
(52) U.S. Cl.
    CPC ........ *C23C 14/351* (2013.01); *H01J 37/3405* (2013.01); *H01J 37/3452* (2013.01); *H01J 37/3458* (2013.01)

(58) Field of Classification Search
None
See application file for complete search history.

(56) References Cited

U.S. PATENT DOCUMENTS

| | | | |
|---|---|---|---|
| 5,902,461 A | | 5/1999 | Xu et al. |
| 6,077,403 A | * | 6/2000 | Kobayashi .......... H01L 21/2855 |
| | | | 257/E21.585 |
| 6,139,696 A | * | 10/2000 | Arunachalam ... H01L 21/02112 |
| | | | 204/192.15 |
| 6,579,421 B1 | | 6/2003 | Fu |
| | | (Continued) | |

OTHER PUBLICATIONS

PCT International Search Report and Written Opinion for PCT/US2022/030600 dated Sep. 8, 2022.

*Primary Examiner* — Jason Berman
(74) *Attorney, Agent, or Firm* — MOSER TABOA

(57) ABSTRACT

Methods of processing a substrate in a PVD chamber are provided herein. In some embodiments, a method of processing a substrate in a PVD chamber, includes: sputtering material from a target disposed in the PVD chamber and onto a substrate, wherein at least some of the material sputtered from the target is guided to the substrate through a magnetic field provided by one or more upper magnets disposed about a processing volume of the PVD chamber above a support pedestal for the substrate in the PVD chamber, one or more first magnets disposed about the support pedestal and providing an increased magnetic field strength at an edge region of the substrate, and one or more second magnets disposed below the support pedestal that increase a magnetic field strength at a central region of the substrate.

18 Claims, 5 Drawing Sheets

(56) References Cited

U.S. PATENT DOCUMENTS

| | | | |
|---|---|---|---|
| 8,920,613 B2* | 12/2014 | Boitnott | H01J 37/3452 |
| | | | 156/345.43 |
| 10,790,180 B2 | 9/2020 | Hsu et al. | |
| 2002/0053322 A1 | 5/2002 | Seeli et al. | |
| 2004/0094509 A1 | 5/2004 | Miyata et al. | |
| 2005/0263390 A1* | 12/2005 | Gung | H01J 37/321 |
| | | | 204/192.15 |
| 2007/0228302 A1* | 10/2007 | Norman, Jr. | H01J 37/3447 |
| | | | 250/505.1 |
| 2011/0048928 A1* | 3/2011 | Kim | C23C 14/0623 |
| | | | 204/192.25 |
| 2013/0101749 A1* | 4/2013 | Yang | H01J 37/3405 |
| | | | 427/523 |
| 2021/0071294 A1 | 3/2021 | Wang et al. | |

* cited by examiner

METHODS FOR SHAPING MAGNETIC FIELDS DURING SEMICONDUCTOR PROCESSING

FIELD

Embodiments of the present disclosure generally relate to semiconductor manufacturing.

BACKGROUND

During semiconductor manufacturing, layers of different materials are etched or deposited on a substrate to form semiconductor structures. In general, depositing the layers in an even or uniform fashion is highly desirable to allow fine control over the semiconductor processes. However, the inventors have observed that often, the deposition of materials in physical vapor deposition (PVD) chambers are not highly uniform due to poor ion capture by the substrate during the deposition processes.

Accordingly, the inventors have provided methods that facilitate capturing ions on the substrate during PVD processes, leading to superior deposition performance.

SUMMARY

Methods of processing a substrate in a PVD chamber are provided herein. In some embodiments, a method of processing a substrate in a PVD chamber, includes: sputtering material from a target disposed in the PVD chamber and onto a substrate, wherein at least some of the material sputtered from the target is guided to the substrate through a magnetic field provided by one or more upper magnets disposed about a processing volume of the PVD chamber above a support pedestal for the substrate in the PVD chamber, one or more first magnets disposed about the support pedestal and providing an increased magnetic field strength at an edge region of the substrate, and one or more second magnets disposed below the support pedestal that increase a magnetic field strength at a central region of the substrate.

In some embodiments, a method of processing a substrate in a PVD chamber, includes: sputtering material from a target disposed in the PVD chamber and onto a substrate, wherein at least some of the material sputtered from the target is guided to the substrate through a magnetic field provided by one or more upper electromagnets disposed about a processing volume of the PVD chamber above a support pedestal for the substrate in the PVD chamber, one or more lower electromagnets disposed about the processing volume between the support pedestal and the one or more upper electromagnets, one or more upper permanent magnets disposed about the processing volume between the one or more upper electromagnets and the one or more lower electromagnets, one or more first magnets disposed about the support pedestal to provide an increased magnetic field strength at an edge region of the substrate, and one or more second magnets disposed below the support pedestal to provide an increased magnetic field strength at a central region of the substrate.

In some embodiments, a method of processing a substrate in a PVD chamber, includes: sputtering material from a target disposed in the PVD chamber and onto a substrate, wherein at least some of the material sputtered from the target is guided to the substrate through a magnetic field provided by one or more upper magnets about a processing volume of the PVD chamber above a support pedestal for the substrate disposed in the PVD chamber, one or more first magnets about the support pedestal, and one or more second magnets below the support pedestal, such that the one or more upper magnets, one or more first magnets, and one or more second magnets, together, provide: a magnetic field having a strength of at least 30 gauss at an upper surface of the substrate, and create a deposition angle of 15 degrees or less with respect to a central axis of the support pedestal.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
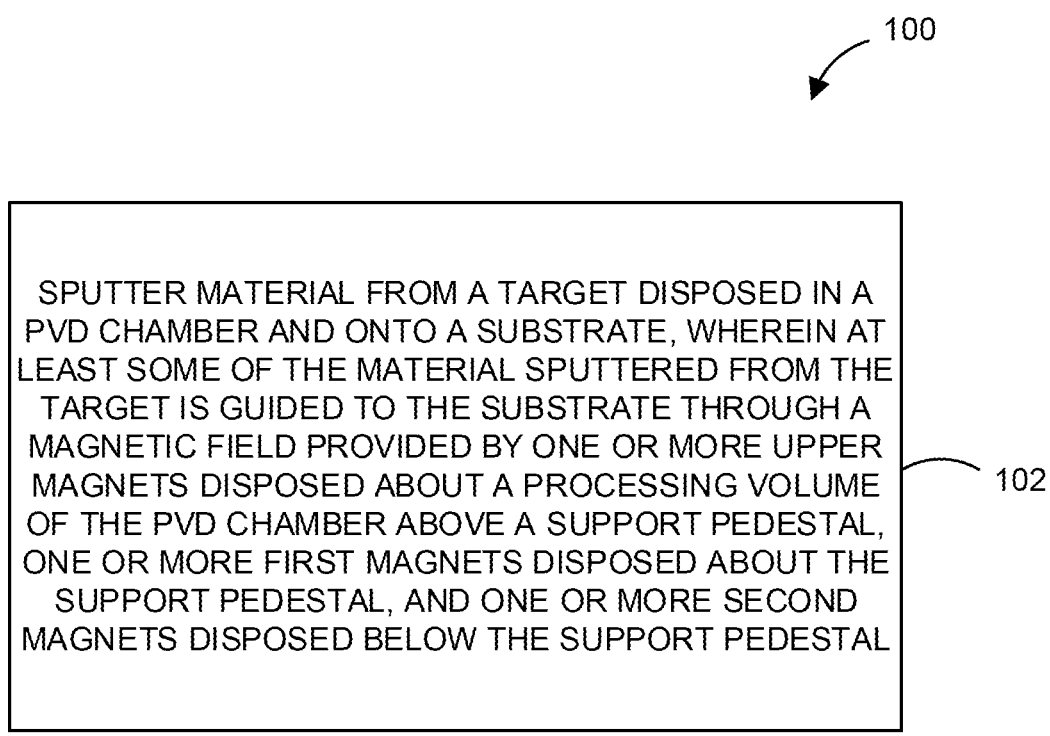
FIG. 1 depicts a flow chart of a method of processing a substrate in a PVD chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods of processing a substrate in a PVD chamber are provided herein. Ion capture at a substrate plane varies with the magnetic field strength and orientation. In some semiconductor chamber designs, the strength and orientation of the magnetic field at the substrate plane is controlled by electromagnets positioned above the substrate plane external to the process chamber. The electromagnets above the substrate plane may have limitations in ensuring normal B-field orientation especially at the wafer edge which results in ion loss at the wafer edge region. The methods provided herein address the lack of normal B-field orientation at the substrate-level and provides an efficient way to enable stronger normal magnetic field lines across the entire substrate plane which helps in the reduction of ion loss and an increase in deposition rate on the substrate.

The methods provided herein generally include sputtering material from a target disposed in the PVD chamber and onto a substrate, wherein at least some of the material sputtered from the target is guided to the substrate through a magnetic field provided by a plurality of magnets, including at least one of: one or more magnets disposed along a horizontal plane that includes the substrate or one or more magnets disposed below the support pedestal. The one or more magnets disposed along a common horizontal plane with the substrate advantageously provides an increased normal magnetic field strength at an edge region of the substrate. The one or more magnets dispose below the support pedestal advantageously provide an increased normal magnetic field strength at a central region of the substrate. The methods provide cost-effective enhancement to existing chamber setups which will enable better plasma vapor deposition (PVD) film properties due to increased ion flux. The methods are also economical as they do not require any electrical or power integration and do not require any change in chamber software to operate the method.

FIG. 1 depicts a flow chart of a method 100 of processing a substrate in a PVD chamber in accordance with at least some embodiments of the present disclosure. At 102, the method 100 includes sputtering material from a target (e.g., target 205) disposed in the PVD chamber (e.g., PVD chamber 200) and onto a substrate (e.g., substrate 206), wherein at least some of the material sputtered from the target is guided to the substrate through a magnetic field. The magnetic field is provided by one or more upper magnets (e.g., one or more upper magnets 229) disposed about a processing volume (e.g., processing volume 208) of the PVD chamber above a support pedestal (e.g., support pedestal 252) for the substrate in the PVD chamber.

The magnetic field is further provided by one or more first magnets (e.g., one or more first magnets 236) disposed about the support pedestal and providing an increased magnetic field strength at an edge region (e.g., edge region 302) of the substrate. In some embodiments, the one or more first magnets are disposed within the interior volume (e.g., interior volume 203) of the PVD chamber. The magnetic field is further provided by one or more second magnets (e.g., one or more second magnets 248) disposed below the support pedestal. The one or more second magnets increase a magnetic field strength at a central region (e.g., central region 304) of the substrate. The increases in the magnetic field strength across the substrate are discussed in more detail with respect to FIG. 7. The one or more first magnets and the one or more second magnets also shape the magnetic field above the substrate so that the magnetic field lines and ion trajectories are more perpendicular (normal) with respect to a top surface of the substrate (discussed in more detail with respect to FIG. 8).

In some embodiments, the one or more upper magnets include one or more upper electromagnets (e.g., one or more upper electromagnets 230) disposed about the processing volume of the PVD chamber above the support pedestal for the substrate. In some embodiments, the one or more upper magnets include one or more lower electromagnets (e.g., one or more lower electromagnets 232) disposed about the processing volume between the support pedestal and the one or more upper electromagnets. In some embodiments, the one or more upper magnets include one or more upper permanent magnets (e.g., one or more upper permanent magnets 234) disposed about the processing volume between the one or more upper electromagnets and the one or more lower electromagnets. The one or more upper magnets help shape the magnetic field above the substrate support.

In some embodiments, the one or more upper magnets, the one or more first magnets, and the one or more second magnets provide a magnetic field having a strength of at least 30 gauss at an upper surface of the substrate. In some embodiments, the one or more upper magnets, the one or more first magnets, and the one or more second magnets provide a magnetic field such that the ion trajectories create a deposition angle of 15 degrees or less with respect to a central axis (e.g., central axis 250) of the support pedestal.

The inventors have observed that using the one or more second magnets without the one or more first magnets increases a magnetic field strength at the edge region as well. However, the increase in magnetic field strength at the central region is much greater than at the edge region such that a deposition rate at the central region may increase while a deposition rate at portions of the edge region remains the same or decreases due to ions being attracted more towards the central region. As such, providing the one or more first magnets and the one or more second magnets advantageously provide multiple tuning knobs to improve PVD film properties (by tuning step coverage, tuning deposition rate, and tuning deposition angle) through improved ion capture based on the parameters of the one or more first magnets and the one or more second magnets. The parameters include, but are not limited to, number of magnets, strength of magnets, position of magnets, and orientation of magnets.

Figure 2:
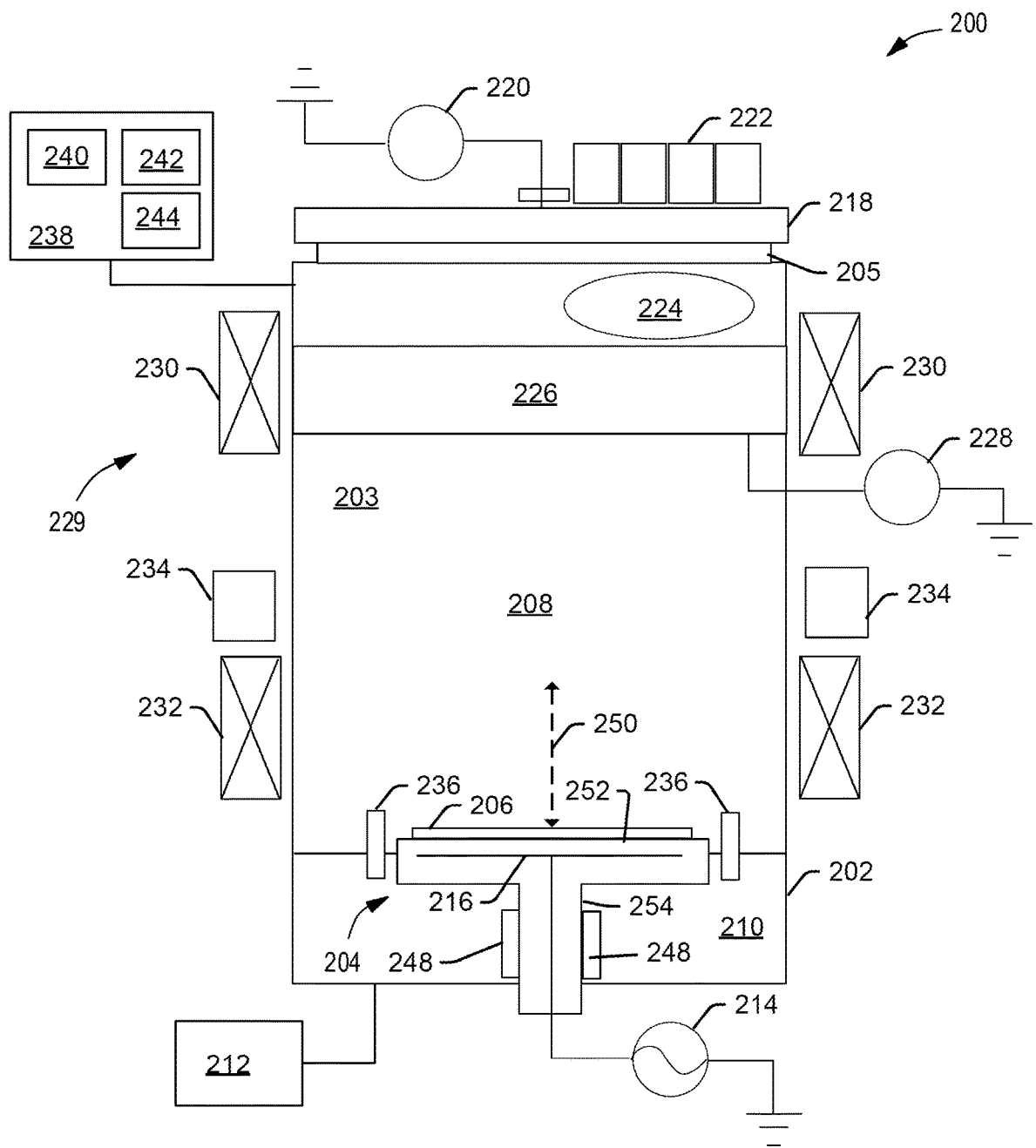
FIG. 2 depicts a schematic side view of a PVD chamber in accordance with at least some embodiments of the present disclosure.

FIG. 2 depicts a schematic side view of a PVD chamber 200 in accordance with at least some embodiments of the present disclosure. The PVD chamber 200 may be used to perform the methods described herein. The PVD chamber 200 generally has a chamber body 202 defining an interior volume 203 therein. A substrate support 204 is disposed in the interior volume 203 and is configured to support a substrate 206 during processing. The substrate support 204 may have a central axis 250 that extends vertically through the processing volume 108 normal to an upper surface of the substrate support 204. The substrate support 204 generally comprises a support pedestal 252 coupled to a support shaft 254. The interior volume 203 includes a processing volume 108 in which the substrate 206 is processed and a non-processing volume 210 that is in fluid contact with a vacuum pump 212 and the processing volume 208. The vacuum pump 212 allows the processing volume 208 to be pumped down to operate in a vacuum during processing. The support pedestal 252 may include an electrostatic chuck that has an electrode 216 disposed therein and that is connected to an RF power supply 214 for biasing the substrate 206 during processing. The PVD chamber 200 may also include an upper electrode 218 that is electrically connected to a plasma DC power supply 220. The PVD chamber 200 may also include a controller 238. The controller 238 controls the operation of the PVD chamber 200 using direct control or alternatively, by controlling the computers (or controllers) associated with the PVD chamber 200.

In operation, the controller 238 enables data collection and feedback from the respective apparatus and systems to optimize performance of the PVD chamber 200. The controller 238 generally includes a Central Processing Unit (CPU) 240, a memory 242, and a support circuit 244. The CPU 240 may be any form of a general-purpose computer processor that can be used in an industrial setting. The support circuit 244 is conventionally coupled to the CPU 240 and may comprise a cache, clock circuits, input/output subsystems, power supplies, and the like. Software routines, such as a method as described below may be stored in the memory 242 and, when executed by the CPU 240, transform the CPU 240 into a specific purpose computer (controller 238). The software routines may also be stored and/or executed by a second controller (not shown) that is located remotely from the PVD chamber 200.

The memory 242 is in the form of computer-readable storage media that contains instructions, when executed by the CPU 240, to facilitate the operation of the semiconductor processes and equipment. The instructions in the memory 242 are in the form of a program product such as a program that implements deposition methods and the like that include the performance parameters of the apparatus to properly tune the depositions. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present disclosure.

A target 205 comprising material to be sputtered is disposed opposite the substrate support 204. A magnet assembly 222 may also be used to control plasma 224 generated in the PVD chamber 200. A collimator 226 electrically connected to a collimator DC power supply 228 may also be used to influence ion trajectories. One or more upper magnets 229 are disposed about the processing volume 208 above the support pedestal 252. In some embodiments, the one or more upper magnets 229 include one or more upper electromagnets 230 used in conjunction with the collimator 226 to additionally influence ion trajectories. One or more lower electromagnets 232 may also be used closer to the substrate support 204 to further influence ion trajectories. For example, the one or more lower electromagnets 232 may be disposed about the processing volume 208 between the support pedestal 252 and the one or more upper electromagnets 230. In some embodiments, one or more upper permanent magnets 234 may be disposed between the one or more upper electromagnets 230 and the one or more lower electromagnets 232. In some embodiments, the one or more upper permanent magnets 234 are disposed about the processing volume 208.

Despite the multiple magnets or magnet assemblies used to influence ion trajectories, the inventors have observed that deposition thicknesses near the edges of the substrates are typically thinner than the central portions of the substrate 206 due to the ion trajectories being less than perpendicular (normal) to the top surface of the substrate 206. The inventors have found that if one or more first magnets 236 are placed around the support pedestal 252 such as, for example, in vacuum space, the film non-uniformity (NU) is reduced, especially at an edge region 302 of the substrate 206. In some embodiments, the one or more first magnets 236 are periodically and symmetrically placed about the support pedestal 252.

In some embodiments, the one or more first magnets 236 are oriented in a south pole up configuration. The magnetic fields produced by the one or more first magnets 236 impinge upon the substrate 206 at the edge region 302. The magnetic fields of the one or more first magnets 236 are dramatically reduced as a distance between the one or more first magnets 236 and the substrate 206 increases, reducing effects of the magnetic fields from the one or more first magnets 236 on the central region 304 of the substrate 206. The strength of the magnetic fields of the one or more first magnets 236 may be adjusted by using different magnetic materials with varying magnetic properties to increase or decrease the magnetic fields, decreasing or increasing the volume of the magnetic material to decrease or increase the strength of the magnetic fields, respectively, and/or decreasing or increasing the number of the permanent magnets to decrease or increase the number and placement of the magnetic fields, respectively.

Placing the one or more first magnets 236 symmetrically around the substrate 206 aids in increasing the magnetic field strength at the edge region 302 and therefore generally increases deposition rates at the edge region 302. As film uniformity is desirable, placing the one or more first magnets 236 symmetrically around the substrate 206 also may aid in deposition uniformity. In some embodiments, the one or more first magnets 236 may be permanent magnets. In some embodiments, the one or more first magnets 236 may be formed of a magnetic material with a maximum energy product of at least 45 MGOe (Mega Gauss Oersted) or N45.

The one or more first magnets 236 may be symmetrically spaced around the substrate 206 in an annular assembly to hold the magnets in place. In some embodiments, between about 10 to 20 cylindrical permanent magnets may be used to surround the substrate 206. As the volume of the magnetic material affects the strength of the permanent magnets, in some embodiments, the permanent magnets may have a diameter of approximately 0.5 inches to approximately 0.75 inches and a height of approximately 2.0 inches to approximately 3.0 inches. In some embodiments, the diameter of the permanent magnets is approximately 0.5 inches and approximately 2.0 inches in length. In some embodiments, the one or more first magnets 236 are positioned to increase a magnetic field strength at the edge region 302 of the substrate 206 by 5 gauss or more, or by 10 gauss or more.

One or more second magnets 248 are disposed below the substrate 206. In some embodiments, the one or more second magnets 248 are disposed vertically below a central region (e.g., central region 304) of the substrate 206. In some embodiments, the one or more second magnets 248 are disposed about or coupled to the support shaft 254. The one or more second magnets 248 may be permanent magnets formed of a similar material to the one or more first magnets 236. The one or more second magnets 248 may be symmetrically spaced around the support shaft 254. In some embodiments, the one or more second magnets 248 may be disposed in an annular assembly to hold the magnets in place. The annular assembly may be used to position the one or more second magnets 248 at a desired radial position from the central axis 250. In some embodiments, the one or more second magnets 248 are positioned to increase a magnetic field strength at the central region 304 of the substrate 206 by 5 gauss or more, or by 10 gauss or more. In some embodiments, the one or more second magnets 248 comprise 6 to 20 magnets.

Figure 3:
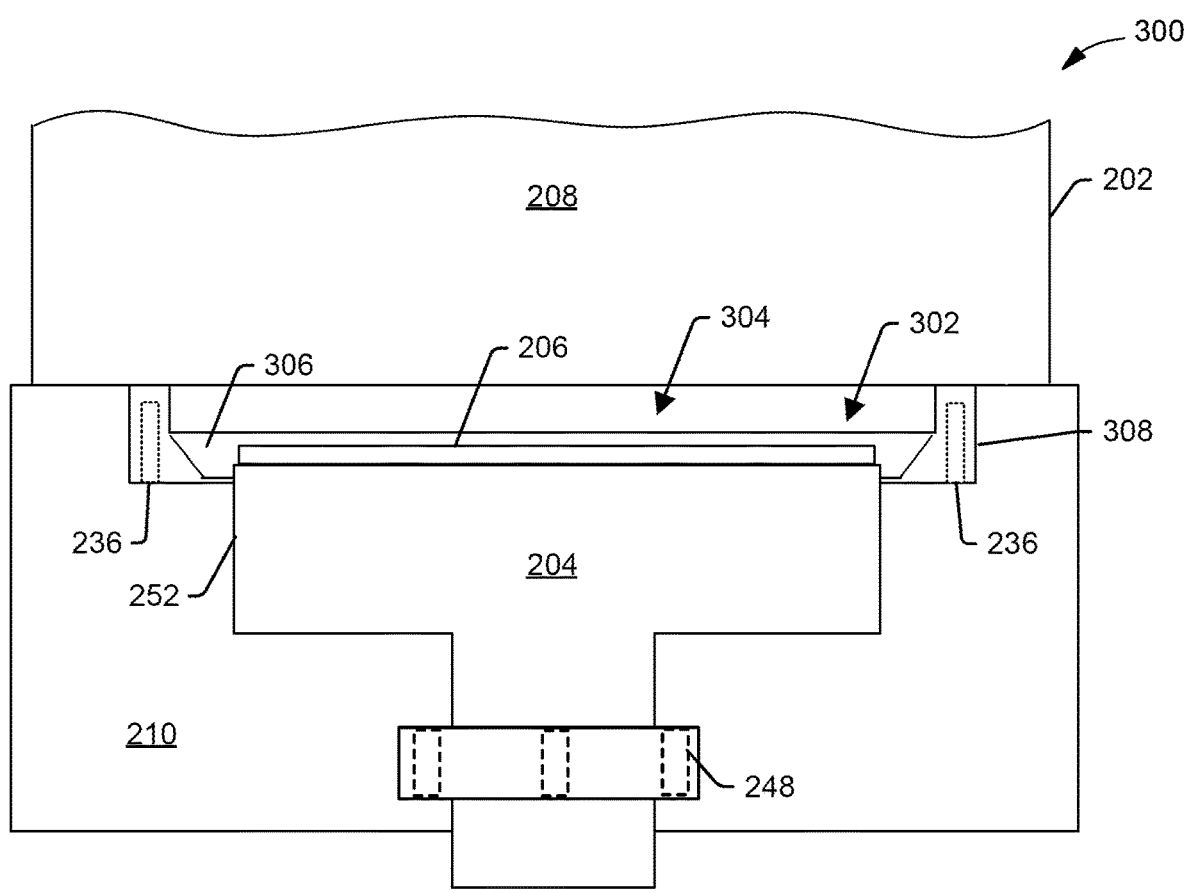
FIG. 3 depicts a schematic side view of a portion of a PVD chamber including a substrate support in accordance with at least some embodiments of the present disclosure.

FIG. 3 depicts a schematic side view 300 of a portion of a PVD chamber 200 including a substrate support 204 in accordance with at least some embodiments of the present disclosure. In some embodiments, the PVD chamber 200 may have a reflector 308 disposed about the support pedestal 252 that is used during deposition reflow processes. In order to heat the bottom surface of the substrate 206, the substrate 206 may be lifted upwards on pins (not shown) such that a bottom surface of the substrate 206 is exposed to a reflective portion 306 of the reflector 308. By using the reflector 308 to heat the underside of the substrate 206 (by reflecting radiant energy from heating lamps in the process chamber), the reflow temperature of the deposition material is more easily maintained.

As discussed above, surrounding the substrate 206 with the one or more first magnets 236 decreases (non-uniformity) NU % of the substrate 206. As the reflector 308 surrounds the substrate 206 during processing, the reflector 308 may also function as an annular assembly to hold the one or more first magnets 236 symmetrically around the support pedestal 252 and the substrate 206. As discussed above, the one or more first magnets 236 increase a magnetic field strength at an edge region 302 of the substrate 206. The one or more second magnets 248 are disposed below the support pedestal 252 and increase a magnetic field strength at a central region 304 of the substrate 206. Together, the one or more first magnets 236 and the one or more second magnets 248 increase the magnetic field strength across the entire substrate 206 as compared to a magnetic field strength without the one or more first magnets 236 and the one or more second magnets 248.

Figure 4A:
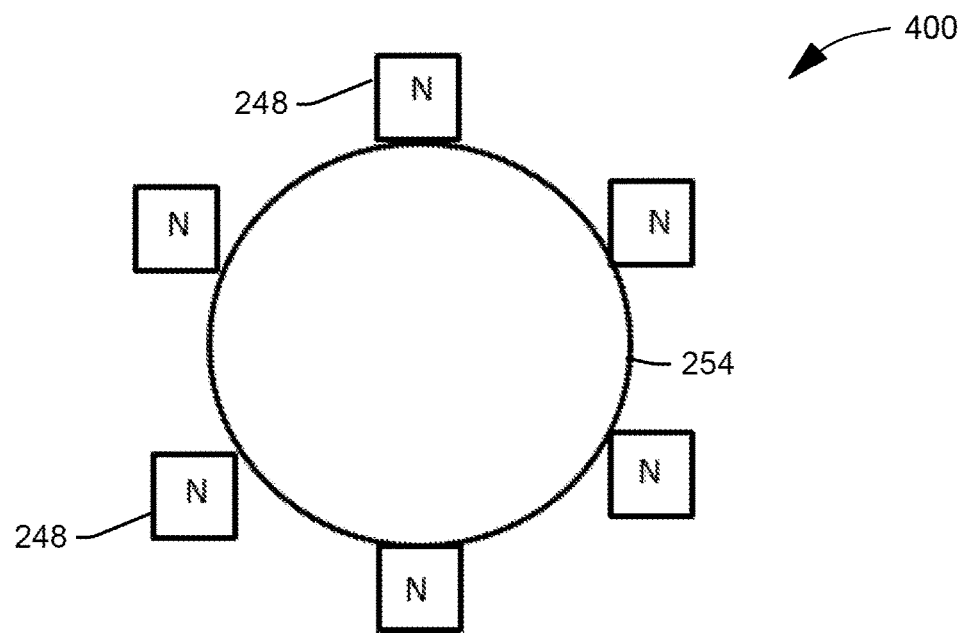
FIG. 4A depicts a schematic top view of an orientation of one or more magnets disposed below a substrate support in accordance with at least some embodiments of the present disclosure.

FIG. 4A depicts a schematic top view 400 of an orientation of the one or more second magnets 248 disposed below a substrate support in accordance with at least some embodiments of the present disclosure. In some embodiments, the one or more second magnets 248 are disposed about the support shaft 254. As shown in FIG. 4A, all of the one or more second magnets 248 may be arranged in a north pole up configuration.

Figure 4B:
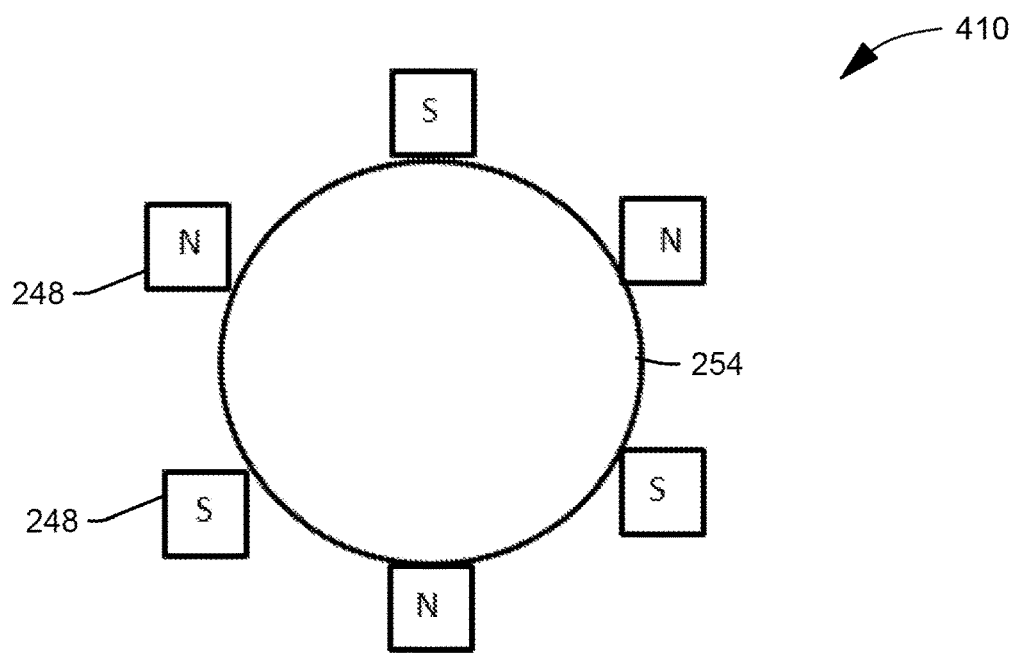
FIG. 4B depicts a schematic top view of an orientation of one or more magnets disposed below a substrate support in accordance with at least some embodiments of the present disclosure.

FIG. 4B depicts a schematic top view 410 of an orientation of one or more second magnets 248 disposed below a substrate support in accordance with at least some embodiments of the present disclosure. In some embodiments, the one or more second magnets 248 are arranged in an alternating pattern of north pole up configuration and south pole up configuration. In other embodiments, the one or more second magnets 248 may be arranged with all magnets north pole out (radially), all magnets north pole in (radially), magnets alternating north pole out and north pole in, or the like. As such, the one or more second magnets 248 may be oriented in different configurations to provide a tuning knob to control the magnetic field at the substrate level and improve PVD film properties in combination with the other magnets of the PVD chamber 200.

Figure 5:
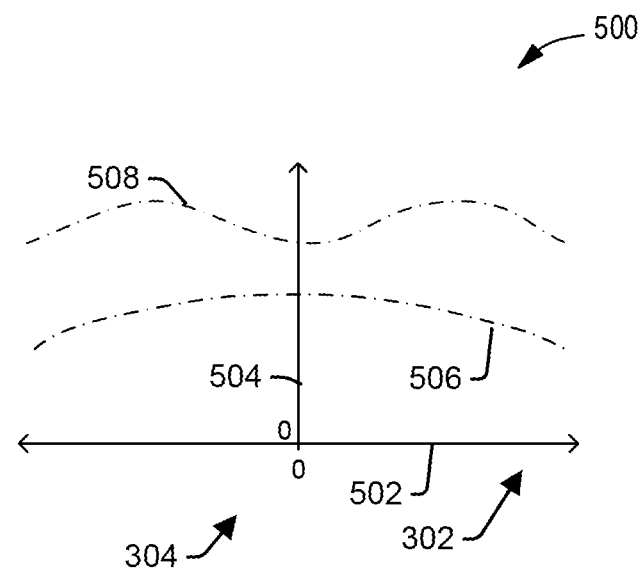
FIG. 5 depicts a chart of magnetic field strengths across a substrate in accordance with at least some embodiments of the present disclosure.

FIG. 5 depicts a chart of magnetic field strengths across a substrate in accordance with at least some embodiments of the present disclosure. As depicted in a graph 500 of FIG. 5, a magnetic strength 504 (gauss level strength) over a radius 502 of a substrate shows a first gauss level 506 over the substrate without the one or more first magnets 236 and the one or more second magnets 248. A second gauss level 508 shows magnetic strength over the substrate with the one or more first magnets 236 surrounding the substrate and the one or more second magnets 248 disposed below the substrate. The gauss level improvement is influenced by the distance of the magnets to the substrate, the number of magnets, the strength of the magnet material, and/or the total volume of the magnetic material and can be tuned accordingly using the parameters.

In some embodiments, the one or more first magnets 236 and the one or more second magnets 248 improve the gauss level across the substrate by approximately 5 to approximately 20 gauss or more. In some embodiments, the one or more first magnets 236 and the one or more second magnets 248 improve the gauss level near the edge region 302 of the substrate by approximately 10 to approximately 20 gauss or more. In some embodiments, as shown in FIG. 5, the magnetic field above the substrate, from an edge region 302 of the substrate to a center of the substrate, increases and then decreases. In some embodiments, the magnetic field at a location about halfway between an edge of the substrate and a center of the substrate is greater than the magnetic field at the edge of the substrate and the center of the substrate. In some embodiments, a strength of a magnetic field (gauss level) above the edge region 302 of the substrate is within about 15 percent of a strength of a magnetic field above the center of the substrate.

Figure 6:
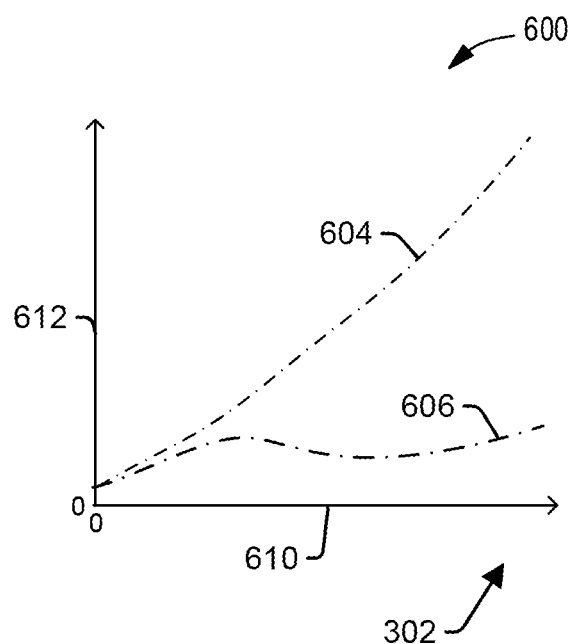
FIG. 6 depicts a chart of effects of magnetic fields on ion trajectories in accordance with at least some embodiments of the present disclosure.

FIG. 6 depicts a chart of effects of magnetic fields on ion trajectories in accordance with at least some embodiments of the present disclosure. The x-axis 610 is a radial distance from the center of the substrate and the y-axis 612 is a deposition angle defined as a delta angle compared to normal of the ions impinging on the top surface of the substrate or compared to the central axis 250. The inventors also discovered, as depicted in a graph 600 of FIG. 6, that the angle of impingement of the ions, or deposition angle, is greater towards the edges of the substrate. By incorporating the present apparatus, the deposition angle of the ions during deposition across the entire substrate and especially near the edge region of the substrate is more normalized, increasing deposition uniformity.

The first deposition angle level 604 does not include the one or more first magnets 236 and the one or more second magnets 248. The second deposition angle level 606 includes the one or more first magnets 236 and the one or more second magnets 248. In some embodiments, the deposition angle is 15 degrees or less, 10 degrees or less, or 8 degrees or less, across the entire substrate for the second deposition angle level 606. In some embodiments, the deposition angle is reduced by about 15 degrees or more at the edge of the substrate between the first deposition angle level 604 and the second deposition angle level 606. The more normalized the deposition angle, the more ions are captured at the surface of the substrate. The less normalized the deposition angle, the more ions that are lost, reducing deposition. As the magnetic fields above the substrate become stronger and more normalized, the ion trajectories will also become more normalized, improving deposition quality by increasing the deposition thickness through higher ion capture at the substrate surface.

In some embodiments, the deposition angle of the second deposition angle level 606, from the center of the substrate to the edge of the substrate, increases, then decreases. In some embodiments, the deposition angle of the second deposition angle level 606, from the center of the substrate to the edge of the substrate, increases, then decreases, and then increases again.

While the foregoing is directed to embodiments of the present disclosure, other and further embodiments of the disclosure may be devised without departing from the basic scope thereof.

The invention claimed is:

1. A method of processing a substrate in a PVD chamber, comprising:
sputtering material from a target disposed in the PVD chamber and onto a substrate disposed on a support pedestal within the PVD chamber, wherein at least some of the material sputtered from the target is guided to the substrate through a magnetic field provided by:
one or more upper magnets disposed about a processing volume of the PVD chamber above the support pedestal,
one or more first magnets disposed within an interior volume of the PVD chamber, disposed about the support pedestal, and configured to provide an increased magnetic field strength at an edge region of the substrate, and
one or more second magnets disposed below the support pedestal that increase a magnetic field strength at a central region of the substrate, wherein the one or more second magnets are arranged in an alternating pattern along an annular path of north pole up configuration and south pole up configuration.

2. The method of claim 1, wherein the one or more first magnets are horizontally aligned with an upper surface of the support pedestal.

3. The method of claim 1, wherein the one or more upper magnets, the one or more first magnets, and the one or more second magnets create a deposition angle of 15 degrees or less with respect to a central axis of the support pedestal.

4. The method of claim 1, wherein the one or more first magnets are positioned to increase a magnetic field strength at the edge region of the substrate by 5 gauss or more, and wherein the one or more second magnets are positioned to increase a magnetic field strength at the central region of the substrate by 5 gauss or more.

5. The method of claim 1, wherein the one or more upper magnets comprise one or more upper electromagnets disposed proximate an upper portion of the PVD chamber, one or more lower electromagnets disposed between the one or more upper electromagnets and the support pedestal, wherein the one or more upper electromagnets are horizontally aligned with and disposed about a collimator disposed in the PVD chamber.

6. The method of claim 1, wherein the one or more first magnets and the one or more second magnets are permanent magnets, and wherein the one or more upper magnets are electromagnets.

7. The method of claim 1, wherein the magnetic field provided by the one or more upper magnets, the one or more first magnets, and the one or more second magnets guides the at least some of the material sputtered from the target to bombard the substrate at a deposition angle of 15 degrees or less with respect to a central axis of the support pedestal.

8. A method of processing a substrate in a PVD chamber, comprising:
sputtering material from a target disposed in the PVD chamber and onto a substrate, wherein at least some of the material sputtered from the target is guided to the substrate through a magnetic field provided by one or more upper electromagnets disposed about a processing volume of the PVD chamber above a support pedestal for the substrate in the PVD chamber, one or more lower electromagnets disposed about the processing volume between the support pedestal and the one or more upper electromagnets, one or more upper permanent magnets disposed about the processing volume between the one or more upper electromagnets and the one or more lower electromagnets, wherein the one or more upper electromagnets, the one or more lower electromagnets, and the one or more upper permanent magnets are vertically aligned, one or more first magnets disposed about the support pedestal to provide an increased magnetic field strength at an edge region of the substrate, and one or more second magnets disposed below the support pedestal to provide an increased magnetic field strength at a central region of the substrate.

9. The method of claim 8, wherein all of the one or more second magnets are arranged in a north pole up configuration.

10. The method of claim 8, wherein the magnetic field above the substrate, from an edge of the substrate to a center of the substrate, increases and then decreases.

11. The method of claim 8, wherein the magnetic field at a location about halfway between an edge of the substrate and a center of the substrate is greater than the magnetic field at the edge of the substrate and the center of the substrate.

12. The method of claim 8, wherein the one or more first magnets and the one or more second magnets are placed such that magnetic field lines above the substrate are more perpendicular with respect to a central axis of the support pedestal.

13. The method of claim 8, wherein the one or more first magnets are disposed in a reflector disposed about the support pedestal.

14. A method of processing a substrate in a PVD chamber, comprising:
sputtering material from a target disposed in the PVD chamber and onto a substrate, wherein at least some of the material sputtered from the target is guided to the substrate through a magnetic field provided by one or more upper magnets about a processing volume of the PVD chamber above a support pedestal for the substrate disposed in the PVD chamber, one or more lower magnets disposed about the processing volume between the support pedestal and the one or more upper magnets, one or more upper permanent magnets disposed about the processing volume between the one or more upper magnets and the one or more lower magnets, one or more first magnets about and aligned with the support pedestal and disposed within an interior volume of the PVD chamber, and one or more second magnets below the support pedestal, wherein the one or more upper magnets, the one or more lower magnets, and the one or more upper permanent magnets are vertically aligned.

15. The method of claim 14, wherein a deposition angle with respect to a central axis of the support pedestal, from an edge of the substrate to a center of the substrate, increases, then decreases, and then increases again.

16. The method of claim 14, wherein a strength of a magnetic field above an edge region of the substrate is within about 15 percent of a strength of a magnetic field above a center of the substrate.

17. The method of claim 14, wherein at least some of the material sputtered from the target is guided to the substrate through a collimator.

18. The method of claim 14, wherein the one or more second magnets are disposed about a support shaft that is coupled to the support pedestal.

* * * * *